(12) United States Patent
Hopper et al.

(10) Patent No.: US 7,262,401 B2
(45) Date of Patent: *Aug. 28, 2007

(54) ACTIVE PIXEL SENSOR CELL WITH INTEGRATING VARACTOR AND METHOD FOR USING SUCH CELL

(75) Inventors: Peter J. Hopper, San Jose, CA (US); Philipp Lindorfer, San Jose, CA (US); Mark W. Poulter, Orinda, CA (US); Yuri Mirgorodski, Sunnyvale, CA (US)

(73) Assignee: Eastman Kodak Company, Rochester, NY (US)

( * ) Notice: Subject to any disclaimer, the term of this patent is extended or adjusted under 35 U.S.C. 154(b) by 43 days.

This patent is subject to a terminal disclaimer.

(21) Appl. No.: 11/496,951

(22) Filed: Aug. 1, 2006

(65) Prior Publication Data

US 2006/0266925 A1 Nov. 30, 2006

Related U.S. Application Data

(62) Division of application No. 10/863,058, filed on Jun. 8, 2004, now Pat. No. 7,102,117.

(51) Int. Cl.
*H01L 27/00* (2006.01)
*H04N 3/14* (2006.01)
(52) U.S. Cl. .................................... 250/208.1; 348/294
(58) Field of Classification Search ............. 250/208.1
See application file for complete search history.

(56) References Cited

U.S. PATENT DOCUMENTS

| 6,452,633 B1 | 9/2002 | Merrill et al. |
| 6,512,544 B1 | 1/2003 | Merrill et al. |
| 6,741,283 B1 | 5/2004 | Merrill et al. |

FOREIGN PATENT DOCUMENTS

| WO | 00/52926 | 9/2000 |
| WO | 01/69651 A2 | 9/2001 |

*Primary Examiner*—Georgia Epps
*Assistant Examiner*—Kevin Wyatt
(74) *Attorney, Agent, or Firm*—Peyton C. Watkins

(57) ABSTRACT

An active pixel sensor cell including at least one photodiode and reset circuitry and an integrating varactor coupled to the photodiode, a method for reading out such a cell, and an image sensor including an array of such cells. The photodiode can be exposed to photons during an exposure interval to accumulate a sequence of subexposure charges at a first node of the photodiode. Each of the subexposure charges accumulates at the first node during a different subexposure interval of the exposure interval. The photodiode is reset during each of a sequence of reset intervals, each reset interval occurring before a different one of the subexposure intervals. An output signal indicative of an exposure charge accumulated at the storage node during the exposure interval can be asserted from the cell, where the exposure charge is indicative of a sum of all the subexposure charges.

12 Claims, 2 Drawing Sheets

ACTIVE PIXEL SENSOR CELL WITH INTEGRATING VARACTOR AND METHOD FOR USING SUCH CELL

CROSS-REFERENCE TO RELATED APPLICATIONS

This is a divisional of application Ser. No. 10/863,058, filed Jun. 8, 2004 now U.S. Pat. No. 7,102,117.

FIELD OF THE INVENTION

The present invention pertains to active pixel sensor cells (e.g., MOS active pixel sensor cells that include at least one MOS transistor and at least one photodiode) and to methods of using them. In some embodiments, the invention pertains to active pixel sensor cells that include at least one photodiode and an integrating varactor for each photodiode, and to methods for using such a cell to generate an exposure signal including by charging a capacitance of one such varactor during a sequence of photodiode subexposures (subintervals of an overall photodiode exposure interval).

BACKGROUND OF THE INVENTION

The expression "MOS device" is used herein as a synonym for an MOS transistor.

The term "varactor" is used herein to denote a semiconductor device in which the electrical characteristic of primary interest is a voltage-dependent capacitance. For example, an NMOS (or PMOS) transistor can be employed as a varactor, with its capacitance determined (in part) by the voltage between its gate and source. For another example, a diode can be employed as a varactor.

The expression "exposure of a photodiode" (or "photodiode exposure") is used herein to denote exposure of the photodiode to photons (to be sensed) during an exposure interval. The expression "subexposure interval" of an exposure interval (or exposure period) is used herein to denote a subinterval of the exposure interval (or exposure period). The expression "subexposure of a photodiode" (or "photodiode subexposure") is used herein to denote exposure of the photodiode to photons (to be sensed) during a subinterval of an exposure interval.

The expression "active pixel sensor cell" is used herein to denote an image sensor that includes at least one active transistor. Typically, an active pixel sensor cell is implemented as an element of an array of identical sensor cells arranged in rows and columns. Typically, an active pixel sensor cell includes at least one photodiode, a reset transistor for each photodiode, and at least one other readout transistor (coupled to a column line) for reading out signals indicative of photogenerated charge that has accumulated on at least one terminal of the photodiode during an exposure or sequence of exposures. Each reset transistor is controlled to reset a photodiode. Typically for each exposure, at least one readout transistor is controlled to assert to a column line a pre-exposure signal indicative of voltage across the photodiode after the photodiode has been reset but before it has been exposed to the photons to be sensed, and then to assert to the column line a post-exposure signal indicative of voltage across the photodiode after the photodiode has been exposed to the photons to be sensed. The pre-exposure and post-exposure signals can be processed by readout circuitry (which is typically located along the column line far from the cell) to generate a signal indicative of photogenerated charge that has accumulated on at least one terminal of the photodiode during the exposure.

One type of conventional active pixel sensor cell is an MOS active pixel sensor cell that include at least one MOS transistor and at least one photodiode. In use, readout circuitry is coupled to the cell (e.g., to a column line coupled to the cell).

Traditional film-based cameras are rapidly being replaced by digital cameras that utilize an array of imaging cells (typically including a large number of imaging cells) to convert received light energy into electric signals indicative of an image. One type of imaging cell that is used in digital cameras to capture incident light energy is an active pixel sensor cell.

FIG. 1 is a schematic diagram of a conventional active pixel sensor cell 100. As shown in FIG. 1, cell 100 includes photodiode 112 (having a first terminal coupled to Node A and a second terminal that is grounded), NMOS reset transistor 114, whose source is connected to photodiode 112 and whose drain is maintained at potential Vdd, NMOS sense transistor 116 (a source follower amplifier transistor) whose gate is connected to photodiode 112 and whose drain is maintained at potential Vdd, and NMOS row select transistor 118 whose drain is connected to the source of sense transistor 116. The source of transistor 118 is coupled to a bitline. When, as is typical, cell 100 is an element of an array of cells arranged along rows and columns, the bit line is a column line. The gate of transistor 118 is coupled to receive a control bit "CTL." Typically (e.g., when cell 100 is an element of an array of cells arranged along rows and columns), CTL is a row select bit that is pulsed high to select a row of sensor cells that includes cell 100.

Operation of active pixel sensor cell 100 typically includes three steps: a reset step in which transistor 114 is briefly pulsed on to place a predetermined initial voltage across photodiode 112; an exposure step in which photons incident on photodiode 112 are converted into electrical charge (i.e., photogenerated charge migrates to the first terminal of photodiode 112 while photodiode 112 is exposed to incident photons, thereby reducing the initial charge that has been placed on the first terminal during the reset step); and a signal readout step in which a signal indicative of the photogenerated charge is read out (i.e., as a current through the channels of transistors 116 and 118).

During the reset step, the gate of reset transistor 114 is pulsed with a reset voltage $V_R$ (e.g., $V_R=5$ volts) to turn on transistor 114. In response, photodiode 112 is reset in the sense that it is charged to an initial voltage, $V_R-V_T$, between its terminals, where $V_T$ is the threshold voltage of reset transistor 114.

During the exposure step, photons that strike photodiode 112 create electron-hole pairs. Resulting photogenerated charge migrates to the terminals of photodiode 112. Photodiode 112 is designed to limit recombination between the newly formed electron-hole pairs. As a result, photogenerated holes are attracted to the second terminal (the grounded terminal) of photodiode 112, while photogenerated electrons are attached to the first terminal of photodiode 1112. Each photogenerated electron that reaches the first terminal reduces the voltage across photodiode 112.

At the end of the exposure step (sometimes referred to as the exposure interval), the final voltage across photodiode 112 is $V_R-V_T-V_S$, where $V_S$ represents the change in voltage due to photogenerated carriers that reach the first terminal of photodiode 112. Thus, $V_S$, which is indicative of the number of photons incident on the photodiode during the exposure interval, is determined by subtracting the voltage at the end of the exposure interval from the voltage at the beginning of the exposure interval: $V_S=((V_R-V_T)-(V_R-V_T-V_S))$.

Active pixel sensor cell 100 is read out by turning on row select transistor 118 (which is turned off during the reset and exposure steps) during a readout step after the exposure step. When row select transistor 118 is turned on, the voltage $(V_R-V_T-V_S)$ on photodiode 112 (Node A's potential above ground) determines the voltage on the gate of sense transistor 116 which, in turn, determines the magnitude of the current flowing through transistors 116 and 118. The current through the channels of transistors 116 and 118 is then detected by a conventional current detector (not shown) connected along the bit line (which is typically a column line).

One drawback of conventional active pixel sensor cells is that they typically operate poorly under low light conditions. With conventional film-based cameras, the amount of time that the shutter is open is adjustable over a wide range (e.g., from one thousandth of a second to capture an image of an object in motion, to several seconds to capture an image of an object under very low light conditions, such as at night).

With a conventional active pixel sensor cell, however, the maximum exposure interval in which a cell can be exposed to light energy is typically on the order of milliseconds. This is because a leakage current in the photodiode (known as dark current) can pull the initial voltage across the photodiode at the start of the exposure interval down to (or nearly to) zero in a time interval of this magnitude. Such leakage current is known as "dark current" because the leakage current can pull the initial photodiode voltage down to (or near to) zero even when no photons are incident on the photodiode.

Thus, when a conventional active pixel sensor cell is exposed to photons during an exposure period, the initial photodiode voltage falls in response to both the incident photons as well as the dark current. When the exposure period is sufficiently short, the dark current reduces the photodiode voltage by only a negligible amount relative to the amount by which photogenerated charge reduces the photodiode voltage.

However, when the exposure period is sufficiently long (e.g., on the order of milliseconds) incident photons cannot accurately be sensed because dark current during the exposure period reduces the photodiode voltage by a non-negligible amount relative to the amount by which photo-generated charge reduces the photodiode voltage. If (as is typical) an active pixel sensor cell cannot provide accurate results when operating with an exposure period of on the order of milliseconds (or longer), the sensor cell is not useful when operating in low light conditions.

There is a need for an imaging cell that can operate accurately with a longer exposure period than can conventional active pixel sensor cells, so that it can accurately sense incident radiation under low light conditions.

SUMMARY OF THE INVENTION

In a class of embodiments, the invention is an active pixel sensor cell that includes at least one photodiode and reset circuitry and an integrating varactor coupled to the photodiode. The reset circuitry is configured to reset the photodiode multiple times during an exposure interval that includes N subexposure intervals, where 2 N (typically, N is greater than 100) so the photodiode can be reset (during a reset interval) before each of the subexposure intervals. The cell has a first capacitance at a first node of the photodiode, the varactor is coupled between the first node and a storage node, the varactor provides a varactor capacitance at the storage node, and the varactor capacitance is much greater than the first capacitance. The first node is typically a terminal of the photodiode, and another terminal of the photodiode is grounded. During each subexposure interval, a subexposure charge accumulates at the first node as a result of photogeneration in the photodiode. The reset intervals are sufficiently short relative to the subexposure intervals and the varactor is configured (e.g., biased) such that an exposure charge accumulates at the storage node during the exposure interval, and the exposure charge at the end of a final one of the subexposure intervals is indicative of the sum of the subexposure charges accumulated during all the subexposure intervals. For example, the exposure charge at the end of the final subexposure interval is at least substantially equal to the sum of the subexposure charges accumulated during the subexposure intervals, or such exposure charge is at least substantially proportional to the sum of the subexposure charges accumulated during the subexposure intervals. The cell also includes output circuitry, coupled to the storage node and configured to assert an output signal (indicative of the charge on or potential of the storage node) at an output of the cell. In some embodiments, the output circuitry includes a source follower transistor whose gate is coupled to the storage node, and the output signal is a current (indicative of the storage node's potential) through the source follower transistor's channel.

In typical embodiments, the varactor is a field effect, gated junction device (e.g., an MOS transistor, or an MOS diode implemented as an MOS transistor but having two rather than three terminals). When the varactor is appropriately biased, its source or drain region provides the varactor capacitance at the storage node.

In a class of preferred embodiments, the inventive cell includes a varactor implemented as an NMOS transistor whose drain is the storage node. Preferably, the cell's output circuitry includes a source follower transistor whose gate is coupled to the storage node, and the cell's output signal is a current (indicative of the potential at the storage node) through the source follower transistor's channel. During operation, the varactor is biased so that the varactor capacitance is physically created by the depleted diffused region of its drain region. To read out a cell in this class, a bit select transistor (having a channel connected in series with the channel of the source follower transistor) can be turned on to allow an external circuit (e.g., an external circuit coupled to the cell by a column line) to sense current (indicative of the storage node's potential and thus indicative of an exposure charge accumulated at the storage node) flowing through the source follower transistor's channel.

In other embodiments, the invention is a method for using any embodiment of the inventive active pixel sensor cell (including an integrating varactor coupled to a storage node) to generate an exposure signal (indicative of the charge on or potential of the storage node) including by charging a varactor capacitance at the storage node during a sequence of photodiode subexposure intervals. The subexposure intervals are subintervals of an overall photodiode exposure interval.

Another aspect of the invention is a method for reading out an active pixel sensor cell including a storage node, at least one photodiode having a first node, and an integrating varactor coupled between the first node and the storage node, said method including the steps of: exposing the photodiode to photons during an exposure interval comprising N subexposure intervals, where 2 N (typically, N is greater than 100) to accumulate a sequence of subexposure charges at the first node, wherein each of the subexposure charges accumulates at the first node during a different one of the subexposure intervals due to photogeneration in the photodiode; resetting the photodiode during each of a sequence of reset intervals, each of the reset intervals occurring before a different one of the subexposure intervals; and asserting an output signal indicative of an exposure charge accumulated at the storage node during the exposure interval, wherein the exposure charge is indicative of a sum of all the subexposure charges. In typical embodiments, the cell has a first capacitance at the first node, the varactor provides a varactor capacitance at the storage node, and the varactor capacitance is much greater than the first capacitance. In some embodiments, the photodiode has a dark current time, and each of the reset intervals and each of the subexposure intervals has duration much less than the dark current time. In other embodiments, the photodiode has a dark current time, each of the reset intervals has duration much less than the dark current time, and each of the subexposure intervals has duration less than the dark current time. In some embodiments, the cell includes a source follower transistor having a gate coupled to the storage node and a channel, and a bit select transistor having a channel connected in series with the channel of the source follower transistor, and the step of asserting the output signal includes the step of asserting a control signal to a gate of the bit select transistor to turn on said bit select transistor, thereby allowing current indicative of the exposure charge to flow through the channel of the bit select transistor and the channel of the source follower transistor.

In some embodiments, the inventive cell includes more than one photodiode (e.g., a photodiode for receiving photons having red wavelength, another photodiode for receiving photons having blue wavelength, and a third photodiode for receiving photons having green wavelength), and an integrating varactor and reset circuitry for each photodiode. Output circuitry (typically including a source follower transistor for each photodiode) is included to allow each photodiode to be read out in accordance with the invention by exposing the photodiode to photons during an exposure interval, resetting the photodiode many times during the exposure interval, and (after the exposure interval) reading out a signal (determined by charge accumulated at the storage node at the end of the exposure interval) indicative of amount of charge photogenerated in the photodiode during the exposure interval.

Another aspect of the invention is an image sensor including an array of cells, wherein each of the cells is an embodiment of the inventive active pixel sensor cell. Typically, the cells of such image sensor are arranged in rows and columns of cells, each of the columns of cells is coupled to a different column line, the cells of each row are coupled to different column lines, and all the column lines are coupled to readout circuitry for reading out all cells of the array after an exposure interval (e.g., by simultaneously reading out all the cells in a first row, then simultaneously reading out all the cells in another row, and so on, until all rows have been read out). Optionally, the image sensor includes additional elements such as amplification circuitry and/or analog-to-digital conversion circuitry for converting the analog output of the readout circuitry to at least one bit stream (e.g., digital still image data or digital video data) indicative of each sensed image.

In preferred embodiments, the inventive active pixel sensor cell is implemented as an integrated circuit, and an image sensor including an array of the inventive active pixel sensor cells is also implemented an integrated circuit.

DETAILED DESCRIPTION OF THE INVENTION

Figure 1:
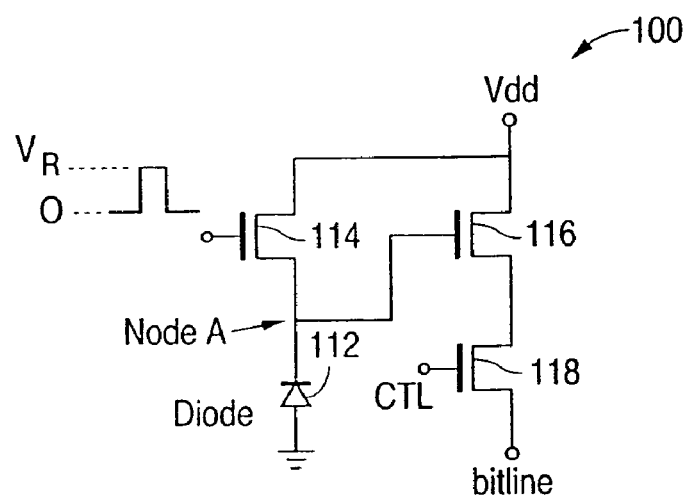
FIG. 1 is a schematic diagram of a conventional active pixel sensor cell.

An embodiment of the inventive active pixel sensor cell (identified in FIG. 2 as cell 200) will be described with reference to FIG. 2. Active pixel sensor cell 200 includes photodiode 212 (having a first terminal coupled to Node B and a grounded second terminal), NMOS reset transistor 214 whose source is connected to Node B and whose drain is maintained at potential Vdd during operation, NMOS transistor 220 (sometimes referred to herein as integrating varactor 220) whose drain is coupled to Node B and whose source is coupled to Node C, NMOS sense transistor 216 (a source follower amplifier transistor) whose gate is connected to Node C and whose drain is maintained at potential Vdd during operation, and NMOS bit select transistor 218 whose drain is connected to the source of sense transistor 216. The source of transistor 218 is coupled to a bitline. When, as is typical, cell 200 is an element of an array of cells arranged along rows and columns, the bit line is a column line and array readout circuitry (not shown) is coupled to the column line. The gate of transistor 218 is coupled to receive a control bit "CTL." Typically (e.g., when cell 200 is an element of an array of cells arranged along rows and columns), control bit CTL is a row select bit that is pulsed high to select a row of sensor cells that includes cell 200.

Many variations on the structure of the inventive cell are contemplated. For example, reset circuitry other than NMOS reset transistor 214 could be coupled to Node B. For example, the reset circuitry could include a PMOS transistor or other transistor having a channel terminal (e.g., a source or drain) coupled to Node B. For another example, circuitry other than NMOS sense transistor 216 and NMOS bit select transistor 218 (e.g., PMOS transistors or other transistors) could be coupled to Node C for use in asserting an output signal (indicative of the potential at Node C or the charge on Vcap) to the bit line at an appropriate time.

Figure 3:
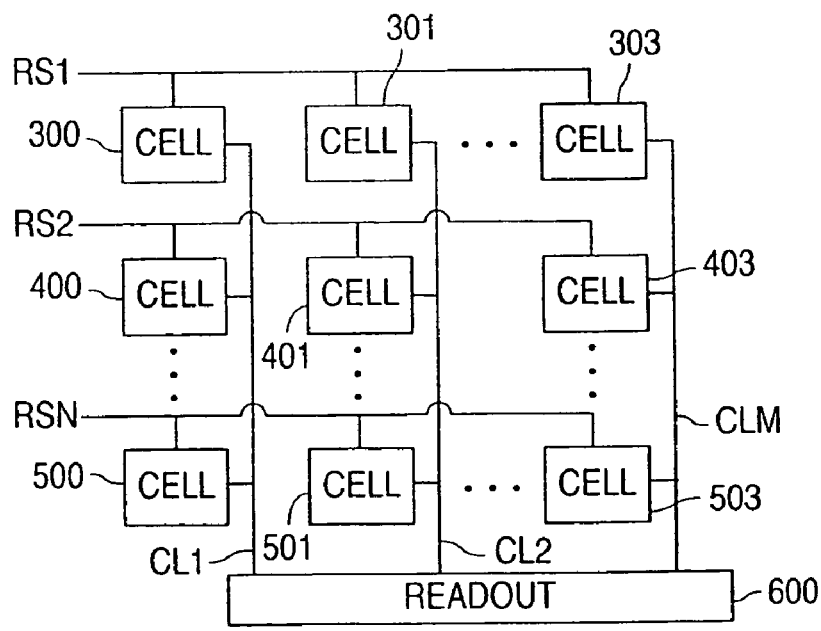
FIG. 3 is simplified block diagram of an image sensor including an M×N array of active pixel sensor cells, wherein each of the cells is an embodiment of the inventive active pixel sensor cell.

FIG. 3 is simplified block diagram of an image sensor that includes an M×N array of active pixel sensor cells. The cells are arranged in rows and columns, and comprise a first row of cells including cells 300, 301, and 303, a second row of cells including cells 400, 401, and 403, and an Nth row of cells including cells 500, 501, and 503. Each cell of the FIG. 3 sensor is an embodiment of the inventive active pixel sensor cell (e.g., each of the cells can be identical to cell 200 of FIG. 2). A different column line is coupled to each column of cells of the FIG. 3 sensor, and readout circuitry 600 is coupled to the column lines. For example, cells 300, 400, and 500 are coupled to column line CL1, cells 301, 401, and 501 are coupled to column line CL2, and cells 303, 403, and 503 are coupled to column line CLM. To read out the sensor at the end of an exposure interval (comprising multiple subexposure intervals), circuitry 600 senses an output current (e.g., a current flowing through the channel of bit select transistor 218 in the case that each cell is identical to cell 200 of FIG. 2) on each of the column lines (each output current from a different cell of one selected row of the cells) while the rows are sequentially selected. For example, during readout, row select bit RS1 (but no other row select signal) is asserted (e.g., pulsed high) to select the first row, then row select bit RS2 (but no other row select signal) is asserted (e.g., pulsed high) to select the second row, then each other row of cells (that is present) is selected (one row at a time), and finally row select bit RSN (but no other row select signal) is asserted to select the Nth row. Typically, readout circuitry 600 includes amplification circuitry and optionally also analog-to-digital conversion circuitry for converting the analog output generated for each column line to a bit stream.

Figure 2:
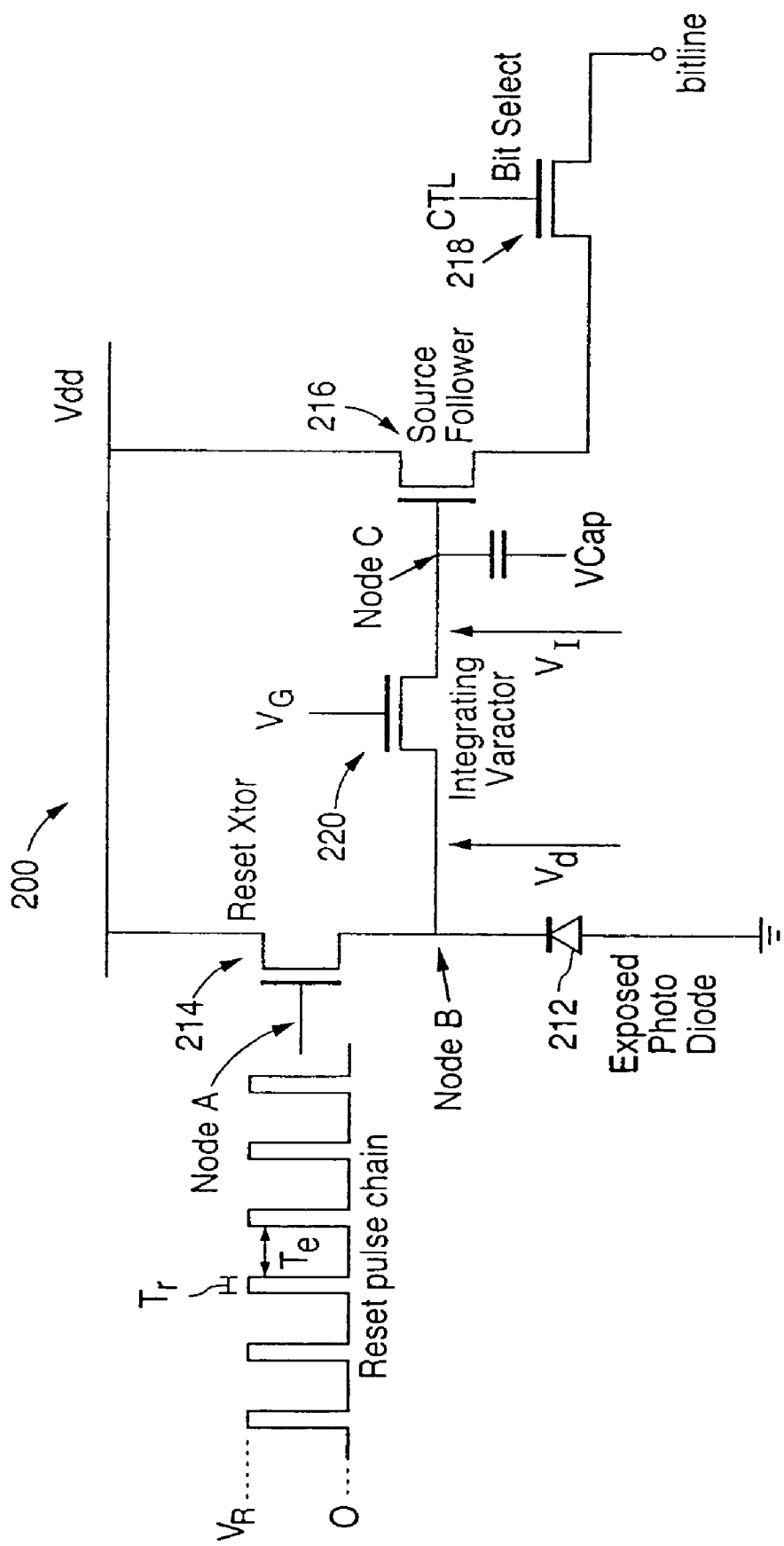
FIG. 2 is schematic diagram of an embodiment of the inventive active pixel sensor cell.

In a class of embodiments, the inventive cell includes a photodiode subject (during operation) to leakage current of the type known as dark current, and such photodiode has a characteristic time to be referred to herein as a "dark current time." For example, photodiode 202 is subject to dark current during operation of cell 200 of FIG. 2, and each implementation of photodiode 202 has a characteristic dark current time. When such a photodiode has been reset to have a predetermined voltage ("V") across its terminals, and a first terminal of the photodiode is then allowed to float while the other terminal is maintained at a reference potential, the "dark current time" is the time in which dark current causes the voltage across the photodiode to fall to fV, where f is a predetermined factor in the range 0.80<f<0.90. Typically, the factor f is equal (or substantially equal) to 0.85.

In a class of embodiments cell 200 is operated in an AC mode, in the following sense. Photodiode 212 is exposed to photons during an exposure interval, while photodiode 212 is reset many times during the exposure interval. After the exposure interval, a signal (determined by charge stored on the varactor at the end of the exposure interval) indicative of amount of charge photogenerated in the photodiode during the exposure interval is read out. In such embodiments, operation of cell 200 includes (2N)+I steps, where N is an integer (N is typically a large integer, e.g., N=1000 or 10,000) and these steps include N performances of a two-step sequence (a reset step followed by a subexposure step) followed by a signal readout step.

Optionally, there is a preliminary readout operation in which photodiode 212 is reset but not exposed to photons, and transistor 214 is then turned off for an interval sufficient for the potential at Node C to match the potential ($V_R-V_T$) at Node B. Cell 200 is then preliminarily read out by asserting control bit CTL with a high value to transistor 218's gate to turn on transistor 218 to cause current flow through the channels of transistors 216 and 218 to readout circuitry, not shown but coupled to the bitline (which is typically a column line). The readout circuitry determines the value ($V_R-V_T$) from this current.

After such preliminary readout operation (if it is performed), the duration of each reset step is much less than the photodiode's dark current time and the duration of each subexposure step is less than (and preferably much less than) the photodiode's dark current time. In typical implementations, photodiode 202's dark current time is on the order of a millisecond, each subexposure step has duration on the order of a microsecond, and each reset step has duration less than (e.g., much less than) that of each subexposure step. In such implementations, the cell can operate accurately with an exposure interval of any duration (provided that N subexposure steps are performed during the exposure interval, where N is at least two). For example, the cell can operate accurately with an exposure interval of 1 millisecond (if $N=10^3$), 10 milliseconds (if $N=10^4$), 1 second (if $N=10^6$), or 10 seconds (if $N=10^7$). In other typical implementations, each subexposure step has duration on the order of $10^{-x}$ seconds (where $5 \leq x \leq 8$, with the particular value of x depending on the dark current time of the photodiode employed), and each reset step has duration less than (e.g., much less than) that of each subexposure step.

During each reset step, a reset voltage pulse having magnitude $V_R$ (e.g., $V_R=5$ volts) and duration $T_r$ is asserted to transistor 214's gate (Node A of FIG. 2) to turn on transistor 214. In response, photodiode 212 is reset in the sense that it is charged to an initial voltage, $V_R-V_T$, between its terminals, where $V_T$ is transistor 214's threshold voltage. Typically, the duration of each reset step is very brief ($T_r$ is very short) relative to the duration of the subexposure step that follows it. During each subexposure step, photons incident on photodiode 212 are converted into electrical charge, and photogenerated charge migrates to the first terminal of photodiode 212 while photodiode 212 is exposed to incident photons, thereby reducing the initial charge that has been placed on the first terminal during the immediately preceding reset step. The gate of transistor 214 is held at ground potential during each subexposure step. In the signal readout step, a signal indicative of the photogenerated charge is read out (i.e., as a current through the channels of transistors 216 and 218).

Thus to read out photodiode 212, photodiode 212 is exposed to photons during an exposure interval (in which photodiode 212 is reset N times, where N can be a large number) and a signal indicative of charge photogenerated in the photodiode during the exposure interval is then read out. Each subexposure step occurs during a subinterval of the exposure interval. The entire exposure interval has duration NT, where T is the duration of each subexposure step, and N is the number of subexposure steps performed.

During each subexposure step, photons that strike photodiode 212 create electron-hole pairs. Resulting photogenerated charge migrates to the terminals of photodiode 212. Photodiode 212 is designed to limit recombination between the newly formed electron-hole pairs, and thus photogenerated holes are attracted to photodiode 212's second terminal (which is grounded) and photogenerated electrons are attracted to photodiode 212's first terminal. Each photogenerated electron that reaches the first terminal reduces the voltage across photodiode 212.

During each of the N reset intervals and each of the N subexposure intervals, transistors 214 and 218 are off and transistor 220 preferably operates in subthreshold. A typical implementation of transistor 220 is operated in subthreshold by maintaining its gate at a potential $0.2 \text{ Volt} \leq V_G \leq 0.3 \text{ Volt}$ above ground.

Transistor 220 provides a capacitance (identified as Vcap in FIG. 2) between Node C and ground. Preferably, this capacitance is physically created by the depleted diffused region of transistor 220's drain region. It should be understood that the capacitance ("Vcap") between Node C and ground in cell 200 is preferably provided without the need for implementing a capacitor in cell 200 that is separate and distinct from transistor 220.

In the following sense, transistor 220 "integrates" a signal indicative of the number of photons incident on photodiode 212 during the full exposure interval. During each subexposure interval, the potential at Node C (the drain of transistor 220) approaches the potential at Node B (identified in FIG. 2 as "$V_d$" above ground) at a rate determined by the time constant associated with transistor 220. This time constant is determined by the capacitance at Node C (which typically is determined in turn by characteristics of the depleted diffused region of transistor 220's drain region).

However, during each reset interval the potential at Node C does not change significantly. This is because the duration of each reset interval is controlled to be sufficiently short that there is insufficient time for the potential at Node C to change significantly during the reset interval (although the potential at Node B typically does change significantly during the reset interval). There are a sufficient number of subexposure intervals within the full exposure interval so that the potential at Node C (at the end of the last subexposure interval) matches the potential at Node B (at the end of the last subexposure interval) to within a predetermined acceptable margin of error.

In order for cell 200 to operate in the manner described in the previous paragraph, transistor 220 and photodiode 212 are implemented (and biased during operation) such that the capacitance at Node B (determined by photodiode 212) is much smaller than the capacitance (Vcap) at Node C. Successful operation of cell 200 thus relies on the proper relation between the time constant associated with the capacitance (Vcap) at Node C (typically determined by transistor 220), the time constant associated with the capacitance at Node B (photodiode 212's capacitance), and photodiode's dark current time.

Each reset pulse in the reset pulse sequence asserted to the gate of reset transistor 214 has a duration $T_r$ such that each reset interval has duration $T_r$ much less than the duration $T_e$ of each subexposure interval, and the potential at Node C does not rise significantly during each reset interval (above its value at the start of the reset interval). Integrating varactor 220 and photodiode 212 are implemented, the duration $T_e$ of each subexposure interval and the number of subexposure intervals per exposure are chosen, so that the potential at Node C falls sufficiently during each subexposure interval that, at the end of the last subexposure interval, the potential at Node C does not differ significantly from the potential at Node B. In other words, over all the subexposure intervals, integrating varactor 220 pumps the voltage at Node C to a value equal (or substantially equal) to the potential at Node B at the end of the last subexposure interval. The overall charge stored on the large area drain capacitance of varactor 220 (Vcap) at the end of the last subexposure interval is larger than the charge stored on photodiode 212 at the start of each individual subexposure interval.

If the potential at Node C at the beginning of the "n"th reset interval is $V_n$, and the potential at Node C at the end of such reset interval is $V_n+\Delta n$, then cell 200 can be implemented such that |Δn| is much smaller than |$V_n$| for each reset interval. The potential at Node B at the end of each reset interval (and thus at the beginning of each subexposure interval) is $V_R-V_T$. If the potential at Node B at the end of each subexposure interval is $V_R-V_T-V_S$, and the potential at Node C at the end of the last subexposure interval is $V_R-V_T-V_S-\Delta V$, then cell 200 can be implemented such that |ΔV| is much smaller than |$V_R-V_T-V_S$|. Thus, cell 200 can be implemented such that at the end of the last subexposure step (i.e., at the end of the exposure interval), the gate-to-source voltage of transistor 216 is $V_R-V_T-V_S$ to within a predetermined margin of error, where $V_S$ represents the change in voltage due to photogenerated carriers that reach the first terminal of photodiode 212 during all the subexposure steps.

During a readout step after the final subexposure step, cell 200 is read out by asserting control bit CTL with a high value to transistor 218's gate to turn on transistor 218 (transistor 218 is off during the reset and subexposure steps). At this time, the potential at node C (the gate of sense transistor 216) is equal to the potential at Node B (to within the predetermined margin of error). Since the potential at Node B (above ground) and thus the gate-to-source voltage on sense transistor 216 are $V_R-V_T-V_S$, the magnitude of the current flowing through the channels of transistors 216 and 218 is indicative of the value $V_R-V_T-V_S$. Readout circuitry, not shown but coupled to the bitline (which is typically a column line), can determine (from the current flowing through the channels of transistors 216 and 218) the value $V_S$, which is indicative of the number of photons incident on the photodiode during the exposure interval, by determining the difference $V_S=((V_R-V_T)-(V_R-V_T-V_S))$, where $(V_R-V_T)$ is the gate-to-source voltage of transistor 216 at the beginning of the exposure interval. The value $(V_R-V_T)$ can be determined by a preliminary readout step of the type described above.

After the final subexposure interval (but before the readout step), the voltage ($V_G$) applied to the gate of varactor 220 can be substantially increased. Due to this applied gate induced vertical field coupling to the integrating node (Node C), through the oxide and the poly edge fringing field, the depleted diffused region of varactor 220's drain region is further depleted. As a result, the capacitance Vcap between Node C and ground is reduced, and the potential at Node C rises (to approach more nearly the potential at Node B at the end of the final subexposure interval). In this way, the current signal (through the channels of transistors 216 and 218) during the readout step is magnified.

The varactor capacitance Vcap can be discharged after the readout step, e.g., by applying sufficiently high voltage ($V_G$) to the gate of varactor 220 to fully turn on varactor 220, and turning off reset transistor 214, and allowing the capacitance Vcap to discharge to ground via photodiode 212 (e.g., as a result of current flow from Node C to Node B and dark current flow from Node B to ground within photodiode 212).

Typical implementations of cell 200 for use with conventional readout circuitry are implemented to operate with the potential Vdd having a relatively low value (e.g., 1 or 2 volts). This is because conventional active pixel sensor cells typically operate with such a relatively low value of Vdd (since conventional active pixel sensor cells would be subject to severe problems due to dark current if operated with a higher value of Vdd), and conventional readout circuitry is typically designed for use with active pixel cells that operate with such a relatively low value of Vdd. However, cell 200 can be implemented either to operate either with a low value of Vdd (e.g., 1 or 2 volts) or a higher value of Vdd, since cell 200 is designed and operated in accordance with the invention to reduce the dark current problem by means other than reduction in the value of Vdd (this dark current reduction is an important advantage of the invention).

When cell 200 is implemented to operate with photodiode 212 providing capacitance (at Node B) in the range 0.3 to 2 femtoFarads, and with Vdd=1 or 2 volts, cell 200 can employ as varactor 220 an NMOS transistor having a typical large area drain capacitance (e.g., on the order of 1 femto-Farad per square micron) and an appropriate size to achieve the desired capacitance Vcap at Node C (a value of Vcap much greater than the capacitance at Node B), with such NMOS transistor implementation of varactor 220 operating in the subthreshold regime during the subexposure intervals of a full exposure with its gate at a potential of 0.2 to 0.3 volts above ground potential.

Various embodiments of the inventive active pixel sensor cell are contemplated. In general, the depth of each photodiode (i.e., the depth of its p-n junction) in the inventive cell affects the photodiode's capacitance. The cell's photodiode's capacitance is preferably minimized subject to the design constraints that pertain to the cell. One typical design tradeoff is the need for fast readout (photodiodes with shallower p-n junctions typically allow faster readout) versus resolution (especially resolution for red light). For example, when the intended use of the cell is detection of visible radiation in the red wavelength range, optimal sensitivity to red light typically requires a photodiode with a relatively deep p-n junction.

If the photon flux density at photodiode 212 varies with time during an exposure interval that comprises subexposure intervals, the potential at Node B (of cell 200) at the end of each subexposure interval (of a sequence of different ones of the subexposure intervals) can have a sequence of different values. Even in this case, although the potential at Node C at the end of the final subexposure interval may not match the potential at Node B at the end of the final subexposure interval, the potential at Node C at the end of the final subexposure interval will be indicative of the number of electrons photogenerated in (and thus the number of photons incident on) the photodiode during the full exposure interval.

Typically, when an entire array of rows and columns of the inventive active pixel sensor cells is exposed to photons for a full exposure interval (including many subexposure intervals), some cells in the array will have a substantial charge (i.e., charge in excess of a threshold) integrated onto their Vcap (i.e., at Node C of each such cell) and will thus be read out as dark cells, and other cells in the array will have a much smaller charge (i.e., charge less than the threshold) integrated onto their Vcap and will thus be read out as bright cells.

Advantages of cell 200 (and at least some other embodiments of the inventive active pixel sensor cell) include the following: longer exposure intervals are possible and even beneficial without the cell being subject to dark current leakage limitations; the photodiode can be implemented with smaller area (i.e., smaller area that is exposed to photons); and an inexpensive implementation process (e.g., an inexpensive standard CMOS process) can be employed to implement the cell since the amount of dark current leakage of the photodiode is much less important to the overall operation of the cell. The total information received from an active pixel sensor cell as a result of an exposure (assuming constant incident photon flux density during the exposure) is indicative of total charge photogenerated during the exposure=(photon flux density)·(diode area)·(exposure time). Thus, not only can the inventive cell can provide accurate results with longer exposure times than can a conventional cell, but the improved (elevated) maximum exposure time allows for a trade off in diode area.

In a variation on the FIG. 2 embodiment, all or some of transistors 214, 216, 218, and 220 are replaced by appropriately biased PMOS transistors. In other embodiments, an integrating varactor other than a PMOS or NMOS transistor is substituted for transistor 220. For example, the integrated varactor in some embodiments of the inventive active pixel sensor cell can be an appropriately biased diode rather than an MOS transistor.

With varactor 220 implemented as an MOS transistor, the capacitance Vcap at node C (of cell 200) can be set at a desired value by implementing this transistor with a desired size (e.g., with the edge of its gate having a desired length) in a manner that will be apparent to those of ordinary skill in the art. The capacitance at node B (of cell 200) is preferably set by implementing photodiode 212 (using CMOS fabrication techniques) as a heavily doped n+ layer over p-type semiconductor material, with the implementation parameters chosen to minimize the capacitance of photodiode 212 subject to other the design constraints, including the constraints that the p-n junction has depth (e.g., is sufficiently shallow) such that photodiode 212 has a predetermined sensitivity to electromagnetic radiation of the desired wavelength range, and that the n+ layer and p-type material have sufficient thickness (and the p-n junction is positioned appropriately) to achieve a sufficiently large volume in photodiode 212 in which photogenerated electrons can be produced and such electrons are likely to migrate to the appropriate photodiode terminal.

In variations on the described embodiments, the photodiode is implemented (and biased during operation) in any of a variety of other ways. For example, the photodiode can be implemented with semiconductor materials of polarity such that photogenerated holes (rather than electrons) migrate to a photodiode terminal during an exposure so as to determine a photodiode voltage that is detected.

In some embodiments, the inventive cell includes more than one photodiode (e.g., one for receiving photons having red wavelength, another for receiving photons having blue wavelength, and a third for receiving photons having green wavelength), and an integrating varactor and source follower transistor (and optionally other elements) for each photodiode. Each photodiode is read out in accordance with the invention by exposing the photodiode to photons during an exposure interval and resetting the photodiode many times during the exposure interval, and (after the exposure interval) reading out a signal (determined by charge stored on the varactor at the end of the exposure interval) indicative of amount of charge photogenerated in the photodiode during the exposure interval.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. An image sensor including an array of active pixel sensor cells, wherein each of the cells includes:

at least one photodiode configured to be exposed to photons during an exposure interval including at least two subexposure intervals;

reset circuitry coupled to the photodiode; and an integrating varactor, coupled between the photodiode and a storage node, and configured so that an exposure charge accumulates at the storage node during the exposure interval; wherein, in each of the cells, the reset circuitry is configured to reset the photodiode during each of a sequence of reset intervals, each of the reset intervals precedes a different one of the subexposure intervals, and the photodiode is configured so that a subexposure charge accumulates at the first node during each of the subexposure intervals, wherein the reset intervals are sufficiently short relative to the subexposure intervals and the varactor capacitance is sufficiently large relative to the first capacitance that the exposure charge at the end of a final one of the subexposure intervals is indicative of the sum of the subexposure charges accumulated at the first node during all the subexposure intervals.

2. The sensor of claim 1, wherein the cells are arranged in rows and columns of cells, said sensor also including:
  a set of column lines, wherein each of the columns of cells is coupled to a different one of the column lines, and the cells of each of the rows are coupled to different ones of the column lines; and
  readout circuitry, wherein the column lines are coupled to the readout circuitry, and the readout circuitry is configured to read out all the cells of the array after an exposure interval.

3. The sensor of claim 1, wherein, in each of the cells, the photodiode has a first node, the varactor is coupled between the first node and the storage node, the cell has a first capacitance at the first node, the varactor provides a varactor capacitance at the storage node, and the varactor capacitance is much greater than the first capacitance.

4. The sensor of claim 1, wherein, in each of the cells, the photodiode has a first node, the reset circuitry is an MOS transistor having a channel terminal coupled to the first node, and the varactor is coupled between the first node and the storage node.

5. The sensor of claim 4, wherein, in each of the cells, the first node is a non-grounded terminal of the photodiode.

6. The sensor of claim 1, wherein each of the cells also includes:
  output circuitry, coupled to the storage node and an output node, and configured to assert at the output node an output signal indicative of the storage node's potential.

7. The sensor of claim 6, wherein, in each of the cells, the output circuitry includes an MOS transistor having a gate coupled to the storage node.

8. The sensor of claim 1, wherein each of the cells also includes:
  output circuitry, coupled to the storage node and an output node, and configured to assert at the output node an output signal indicative of the charge on the storage node.

9. The sensor of claim 1, wherein, in each of the cells, the varactor is a field effect, gated junction device.

10. The sensor of claim 9, wherein, in each of the cells, the photodiode has a first node, the reset circuitry is a transistor having a channel terminal coupled to the first node, and the varactor is an MOS transistor whose channel is coupled between the first node and the storage node.

11. The sensor of claim 9, wherein, in each of the cells, the varactor is biased during operation such that one of a source region and a drain region of the varactor provides the varactor capacitance at the storage node.

12. The sensor of claim 11, wherein, in each of the cells, the varactor is an NMOS transistor that is biased during operation such that a drain region of said varactor provides the varactor capacitance at the storage node.

* * * * *